(12) United States Patent
Yang et al.

(10) Patent No.: US 7,839,170 B1
(45) Date of Patent: Nov. 23, 2010

(54) LOW POWER SINGLE RAIL INPUT VOLTAGE LEVEL SHIFTER

(75) Inventors: Ge Yang, Pleasanton, CA (US); Hwong-Kwo Lin, Palo Alto, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 12/404,183

(22) Filed: Mar. 13, 2009

(51) Int. Cl.
*H03K 19/0175* (2006.01)
*H03L 5/00* (2006.01)
(52) U.S. Cl. .............................. 326/68; 326/81; 327/333
(58) Field of Classification Search .................... 326/62, 326/63, 68, 82–87; 327/333
See application file for complete search history.

(56) References Cited

U.S. PATENT DOCUMENTS

| | | | | |
|---|---|---|---|---|
| 4,516,861 A * | 5/1985 | Frew et al. | ................. | 368/120 |
| 5,422,523 A * | 6/1995 | Roberts et al. | ................. | 326/68 |
| 5,952,868 A * | 9/1999 | Gowni et al. | ................. | 327/362 |
| 6,252,447 B1 * | 6/2001 | McClure | ...................... | 327/175 |
| 7,573,314 B2 * | 8/2009 | Nagayama | ................... | 327/333 |
| 7,652,504 B2 * | 1/2010 | Campbell et al. | .............. | 326/68 |
| 2003/0080780 A1 * | 5/2003 | Okamoto et al. | .............. | 326/83 |
| 2008/0143417 A1 * | 6/2008 | Campbell et al. | ........... | 327/333 |

\* cited by examiner

*Primary Examiner*—Rexford N Barnie
*Assistant Examiner*—Thienvu V Tran
(74) *Attorney, Agent, or Firm*—Patterson & Sheridan, LLP.

(57) ABSTRACT

One embodiment of the present invention sets forth a technique for shifting the voltage level of signals from a low voltage domain to a high voltage domain, where VDDH is the supply voltage of the high voltage domain and VDDL is the supply voltage of the low voltage domain. A level shifting circuit uses a single input rather than dual rail inputs and does not produce a direct current flow in order to reduce the power consumption. The voltage level shifting circuit may also be used to shift a clock signal since the delays of the rising and falling edges of the clock signal are matched by using a delay element.

14 Claims, 12 Drawing Sheets

PRIOR ART

PRIOR ART

LOW POWER SINGLE RAIL INPUT VOLTAGE LEVEL SHIFTER

BACKGROUND OF THE INVENTION

1. Field of the Invention

The present invention generally relates to digital voltage level shifter circuits and more specifically to a level shifter circuit to shift a signal from a low voltage domain to a high voltage domain without a direct current leakage path.

2. Description of the Related Art

Conventional integrated circuit devices use different voltage levels for different logic blocks within a single integrated circuit device. Logic blocks that have critical timing typically operate using a higher power supply compared with logic blocks that do not have critical timing. While it is desirable to use a lower power supply in order to reduce power, some logic blocks require a higher power supply to meet performance requirements. A voltage level shifter circuit is used to convert the voltage level of signals to transmit those signals between logic blocks that operate using different supply voltages.

FIG. 1 illustrates a level shifter circuit 100 configured to shift signals from a low voltage domain that uses a VDDL voltage supply to a high voltage domain that uses a VDDH voltage supply, according to the prior art. Circuit 100 includes two PMOS transistors, 115 and 135 and two NMOS transistors, 110 and 130. VDD 125 is set to VDDH and ground 220 is set to the ground voltage of 0 volts. The input 105 ranges between ground and VDDL and the output 150 should range between ground and VDDH. When input 105 is a logical false (ground voltage), transistors 110 and 135 are off and transistors 115 and 130 are activated, and output 150 is discharged to the ground voltage.

When input 105 is a logical true (VHHL), transistor 130 is off, transistors 110 and 135 are activated. Transistor 115 is partially or fully activated depending on the value of VDDH, VDDL, and the device threshold voltage (Vth). Assuming a VDDL of 0.8V+/−10%, VDDH of 1.0V+/−10%, and Vth=100 mV (fast-fast process corner) and ~350 mV (slow-slow process corner), the worst case conditions are VDDL=0.72V, VDDH=1.1V, and Vth=200 mV. The voltage at the source of transistor 115 is 1.1V and the voltage at the gate of transistor is 0.72V, producing a gate-to-source voltage (Vgs) of 380 mV which is larger than the threshold voltage of 200 mV, so transistor 115 is activated. When transistors 115 and 110 are both fully activated there is a direct current path between VDD 125 and ground 120, which consumes a lot of power. In order to reduce the power consumed to shift the voltage levels of signals between different power domains, a dual rail input level shifter circuit may be used.

FIG. 2 illustrates a level shifter circuit 200, configured to shift signals from a low voltage domain to a high voltage domain using dual rail inputs, according to the prior art. Input_b 205 and input 245 are complimentary signals. Circuit 200 includes two PMOS transistors, 215 and 235 and two NMOS transistors, 210 and 230. VDD 225 is set to VDDH and ground 220 is set to the ground voltage of 0 volts. Input_b 205 and input 245 each ranges between ground and VDDL and output 250 should range between ground and VDDH. When VDDL is applied to input 245 and a logical zero (ground voltage) is applied to input_b 205, transistors 215 and 230 are activated. Node 212 is charged to VDDH and node 232 is discharged to the ground voltage. The inverter 240 charges output 250 to VDDH and there is no direct current flowing between VDD 225 and ground 220. However, circuit 200 requires two inputs instead of a single input to level shift each signal from the low voltage domain to the high voltage domain, doubling the number of wires that are routed to each voltage level shifter circuit 200. In circuit designs that are routing limited, it is desirable to use a single rail input instead of a double rail input circuit.

Accordingly, what is needed in the art is a system and method for shifting the voltage level of signals from a low voltage domain to a high voltage domain using a single input without producing a direct current leakage path.

SUMMARY OF THE INVENTION

Various embodiments of the invention comprise a voltage level shifter circuit for shifting an input signal from a low voltage domain that uses a low voltage supply to a high voltage domain that uses a high voltage supply. The voltage level shifter circuit includes a first inverter circuit, a second inverter circuit, a first NMOS transistor, a first PMOS transistor, and a second PMOS transistor. The first inverter circuit is configured to receive a power down signal from the high voltage domain and produce a first intermediate signal. The second inverter circuit is configured to produce an output signal for the high voltage domain that is a voltage shifted version of the input signal. The first PMOS transistor is coupled between a high voltage supply of the high voltage domain and an input to the second inverter circuit and configured to receive the first intermediate signal at a gate and pull the input to the second inverter circuit up to the high voltage supply when the power down signal is at the high voltage supply. The second PMOS transistor is coupled to the high voltage supply and configured to disable a direct current leakage path between the high voltage supply and the ground voltage when the power down signal is at the high voltage supply. The first NMOS transistor is coupled to a ground voltage and configured to disable the direct current leakage path when the power down signal is at the high voltage supply.

One advantage of the disclosed voltage level shifting circuit is that it shifting the voltage level of signals from a low voltage domain to a high voltage domain using a single input without producing a direct current leakage path. The voltage level shifting circuit may also be used to shift a clock signal since the delays of the rising and falling edges of the clock signal are matched by using a delay cell.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
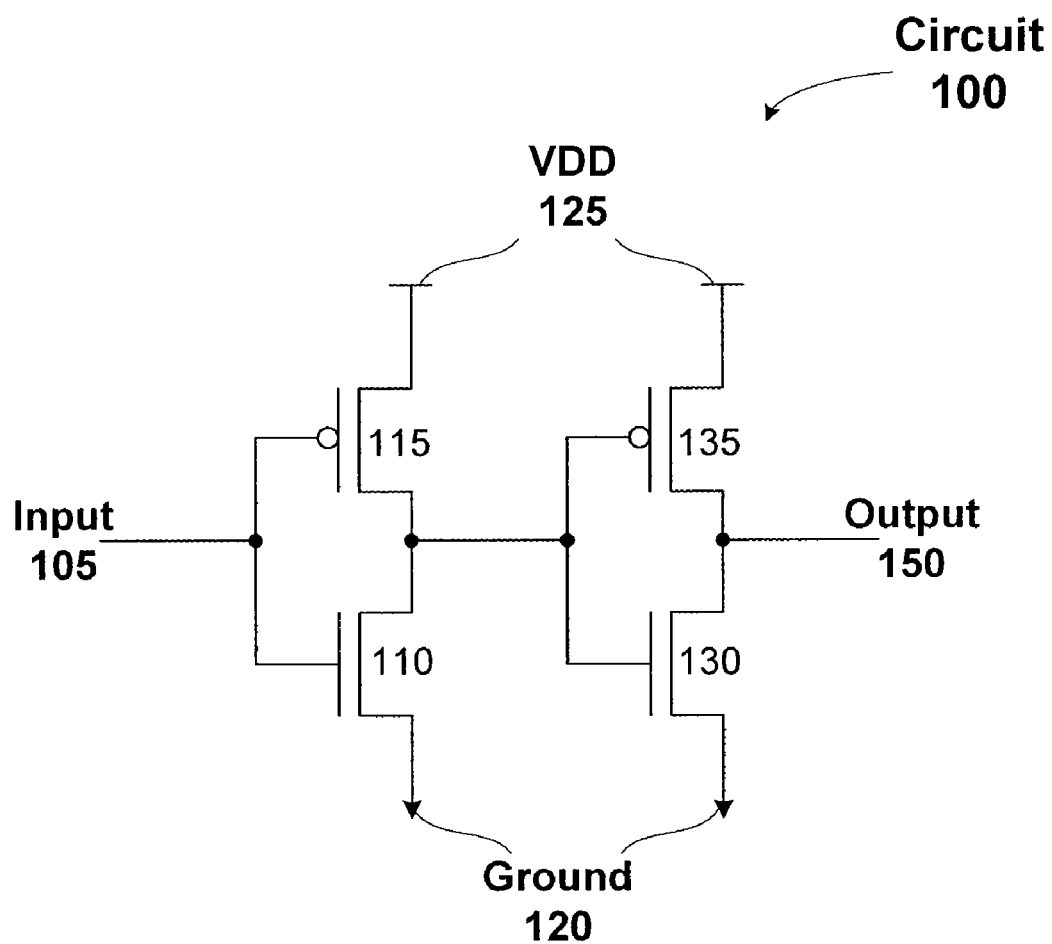
FIG. 1 illustrates a level shifter circuit, according to the prior art.
Figure 2:
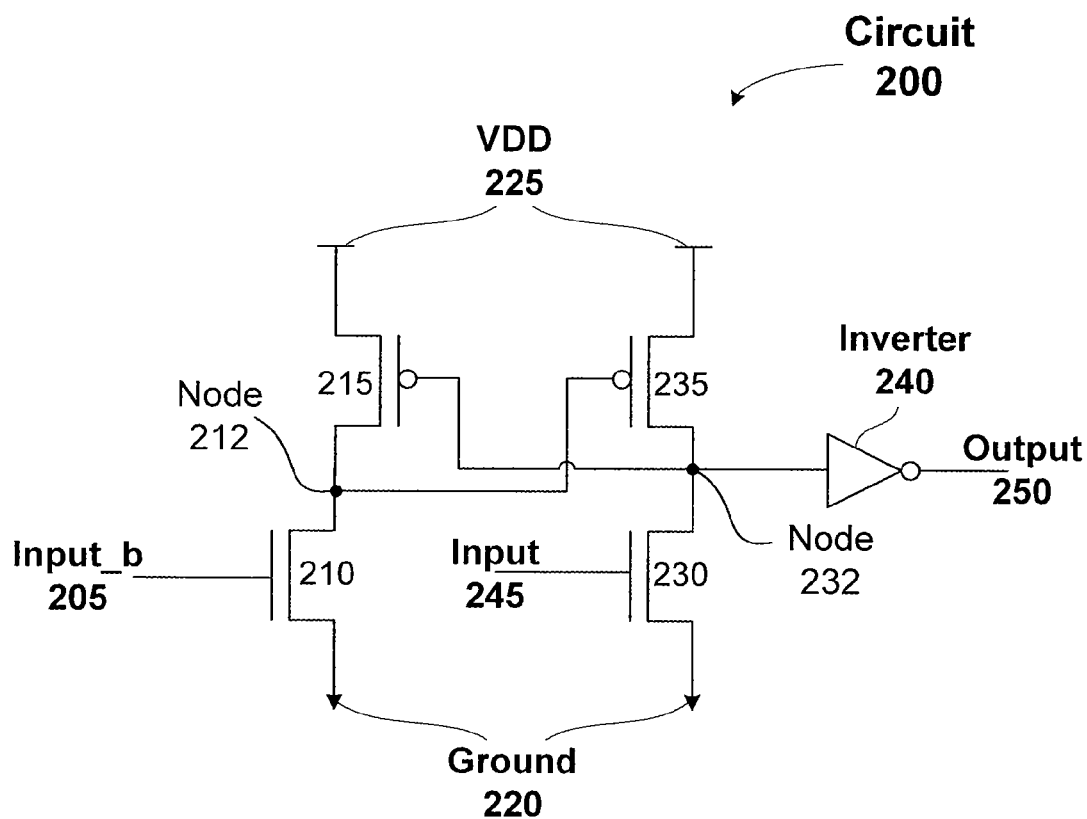
FIG. 2 illustrates another level shifter circuit, according to the prior art.
Figure 3:
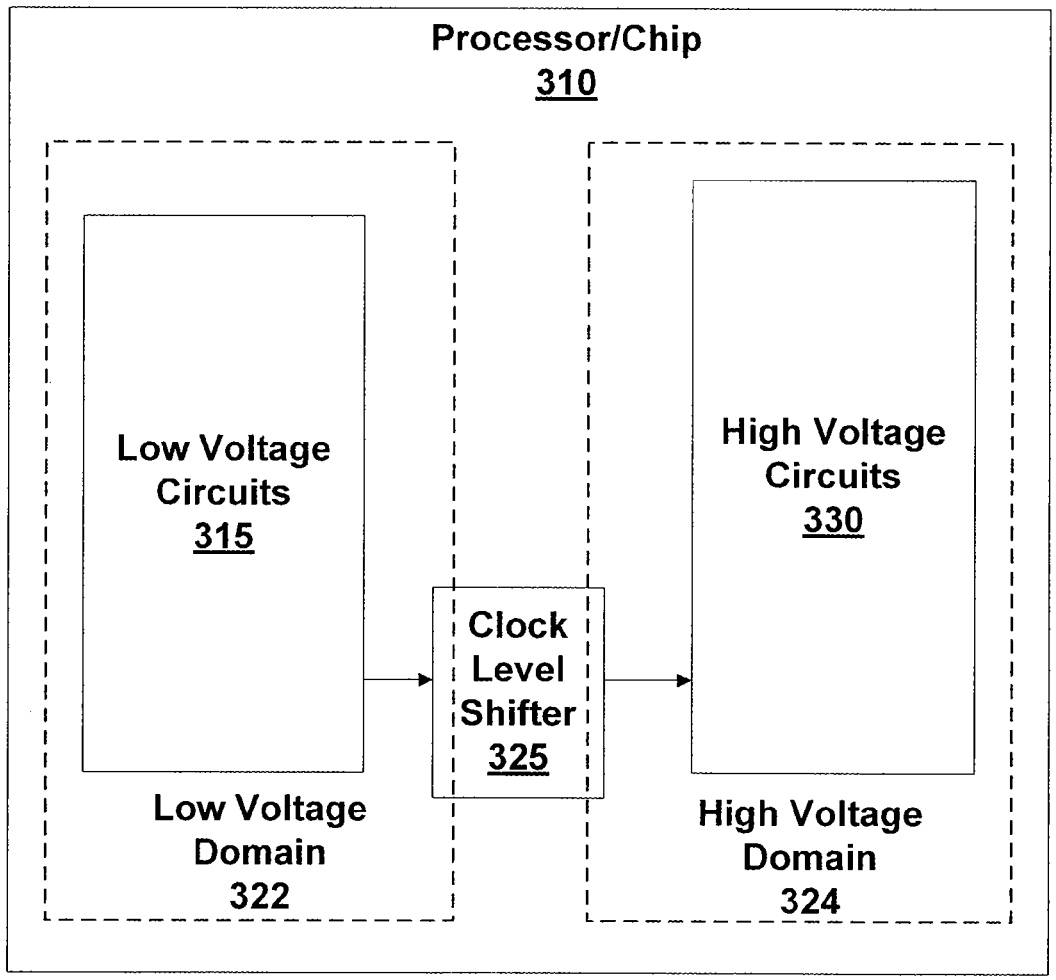
FIG. 3 is a block diagram illustrating a processor/chip with a voltage level shifter configured to implement one or more aspects of the present invention.

FIG. 3 is a block diagram illustrating a device that includes a voltage level shifter 320 configured to implement one or more aspects of the present invention. Low voltage circuits 315 is within a low voltage domain 322 and operates at a VDDL voltage level that is lower than the VDDH voltage level used by high voltage circuits 330. High voltage circuits 330 is within a high voltage domain 330 and includes circuits that operate at the VDDH voltage. Voltage level shifter 325 is within both the low voltage domain 322 and the high voltage domain 324 and is configured to shift one or more signals from the VDDL voltage used in the low voltage domain 322 to the VDDH voltage level used in the high voltage domain 324 for input to the high voltage circuitry 330. Voltage level shifter 325 is described in detail in conjunction with FIGS. 4A, 4B, 4C, 5, 6A, 6B, 6C, 7A, and 7B.

Figure 4A:
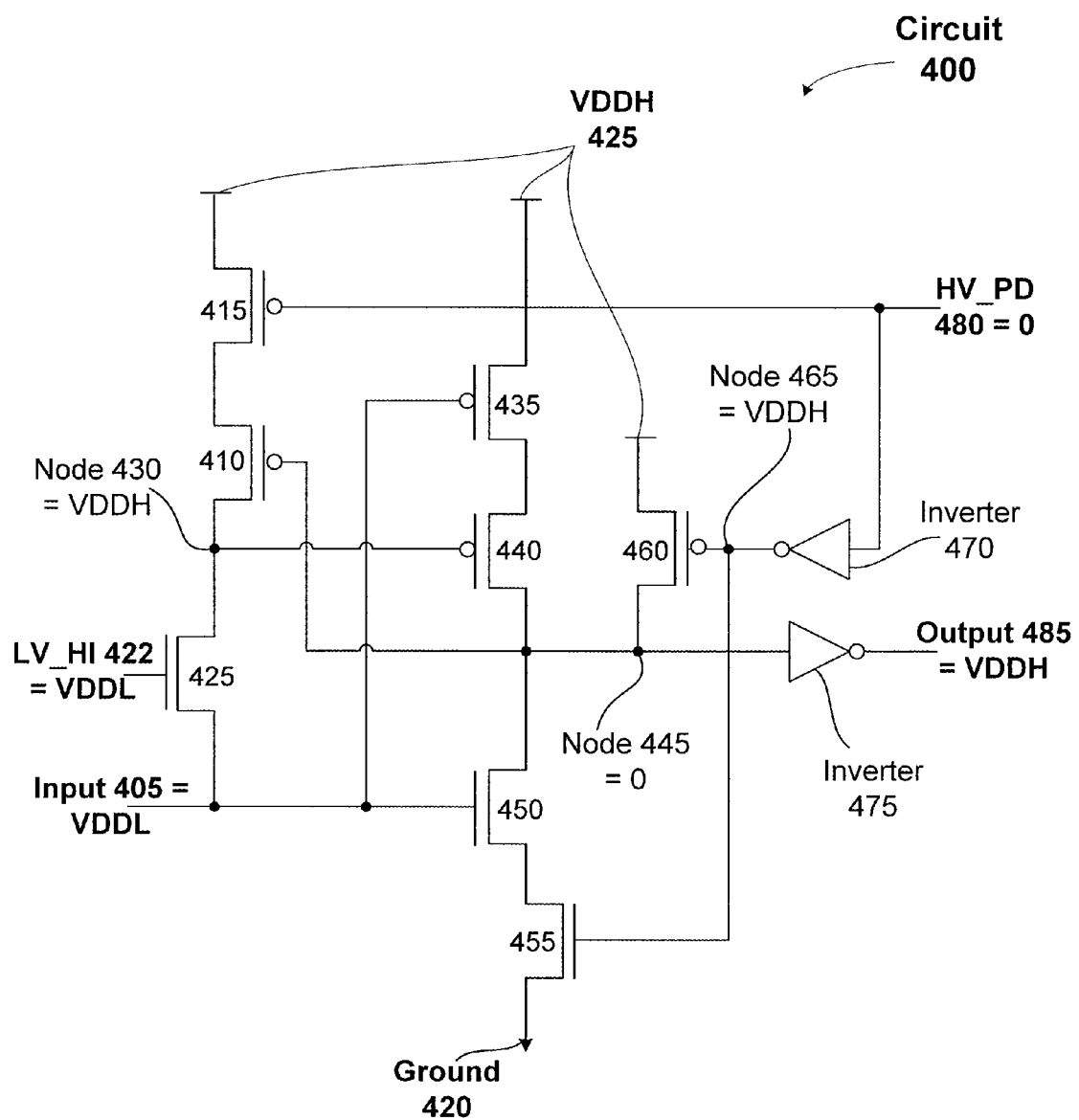
FIG. 4A illustrates a level shifter circuit for shifting a signal from a low voltage domain to a high voltage domain when a low voltage is applied to the input, according to one embodiment of the invention.

FIG. 4A illustrates a level shifter circuit 400 for shifting an input signal 405 from a VDDL voltage to a VDDH voltage, producing an output signal 485, according to one embodiment of the invention. Unlike circuit 100, voltage level shifter circuit 400 does not have a direct current leakage path between VDDH 425 and ground 420 and therefore does not consume as much power as circuits 100. Voltage level shifter circuit 400 also requires a single input 405 instead of dual inputs as required by circuit 200.

A power down signal is input to HV_PD 480 that clamps the output 485 to ground 420 when HV_PD 480 is VDDH so no direct currents flow in voltage level shifter 400 when the input and LV_HI are unknown, i.e. floating. When HV_PD 480 is VDDH, the LV_HI 422 input and the input 405 are ignored and can be at ground, VDDL, or anywhere between. The input 405 is the single rail input coming from the low voltage domain. LV_HI 422 is the reference voltage from the low voltage domain, VDDL. HV_PD 480 and LV_HI 422 are not timing critical and can therefore be connected to hundreds of voltage level shifters 400. Assuming that there 1000 signals going from the low voltage domain to the high voltage domain, 2000 signals are routed when the dual rail input level shifter circuit 300 is used. In contrast, the voltage level shifter circuit 400 requires routing only 1000+2 signals (excluding HV_PD).

When the VDDL voltage is applied to LV_HI 422, ground is applied to HV_PD 480, and VDDL is applied to input 405, the output 485 is charged to VDDH, as shown in FIG. 4A. Transistor 415 is activated when HV_PD 480 is at the ground voltage and the source of transistor 410 is pulled to VDDH 425 by transistor 415. The inverter 470 pulls node 465 to VDDH and activates transistor 455 to discharge the source of transistor 450 to ground. Transistor 460 is disabled by the inverter 470 pulling node 465 to VDDH, isolating node 445 from VDDH 425.

Transistor 450 is activated by the input 405 and node 445 is discharged to the ground 420 through transistors 450 and 455. When node 445 is discharged to the ground, the inverter 475 pulls the output 485 to VDDH 425. Transistor 435 is partially or fully activated, depending on the value of VDDL, VDDH, and the threshold voltage. The size of transistors 450 and 455 will guarantee that node 445 can be pulled down to the ground 420 even if transistor 435 is fully on. Transistors 440 and 410 are used to cut off the direct current that would flow through activated transistors 435 and 450. Since the node 445 is discharged to the ground 420, transistor 410 is activated and transistor 410 pulls up the node 430 to VDDH. The source and gate of transistor 440 are both at VDDH, so transistor 440 is disabled and there is no direct current flowing from VDDH 425 to ground 420 through transistors 435, 440, 450, and 455. The drain of transistor 425 is at VDDH and the gate and the source of transistor 425 are both at VDDL, so transistor 425 is disabled.

Figure 4B:
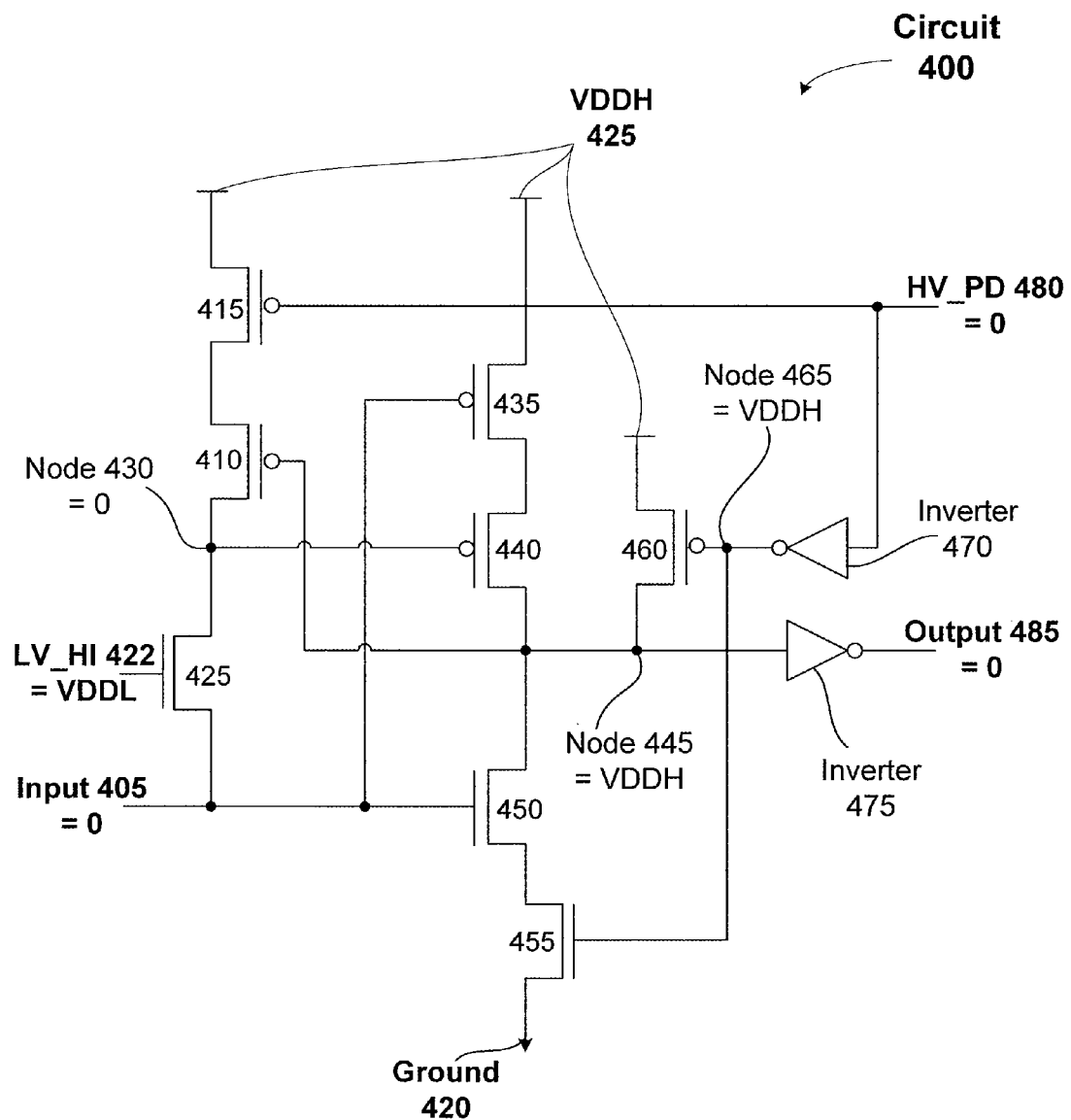
FIG. 4B illustrates the level shifter circuit of FIG. 4A when a ground voltage is applied to the input, in accordance with one or more aspects of the present invention.

FIG. 4B illustrates the voltage level shifter circuit 400 of FIG. 4A when the ground voltage is applied to the input 405, in accordance with one or more aspects of the present invention. When the VDDL voltage is applied to LV_HI 422, and ground is applied to HV_PD 480 and the input 405, the output 485 is discharged to the ground voltage. Transistor 415 is activated when HV_PD 480 to pass VDDH 425 to the source of transistor 410. The inverter 470 pulls node 465 to VDDH and activates transistor 455 to discharge the source of transistor 450 to ground. Transistor 460 is disabled by the inverter 470 pulling node 465 to VDDH, isolating node 445 from VDDH 425.

When the VDDL voltage is applied to LV_HI 422 and ground is applied to HV_PD 480 and the input 405, the output 485 is discharged to the ground, as shown in FIG. 4B. Transistor 450 is not activated and transistor 435 is activated to pull the source of transistor 440 to VDDH 425. Transistor 425 is activated and the gate of transistor 440, node 430 is discharged to the ground voltage, activating transistor 440. Transistors 435 and 440 pull node 445 to VDDH. Transistor 410 is a weak pull-up device and transistor 425 is sized to guarantee that transistor 425 can pull node 430 to ground when transistor 410 is activated. When node 445 is charged to VDDH, transistor 410 is not activated and output 485 is pulled down by the inverter 475. There is no direct current flowing from VDDH 425 to the ground 420.

Figure 4C:
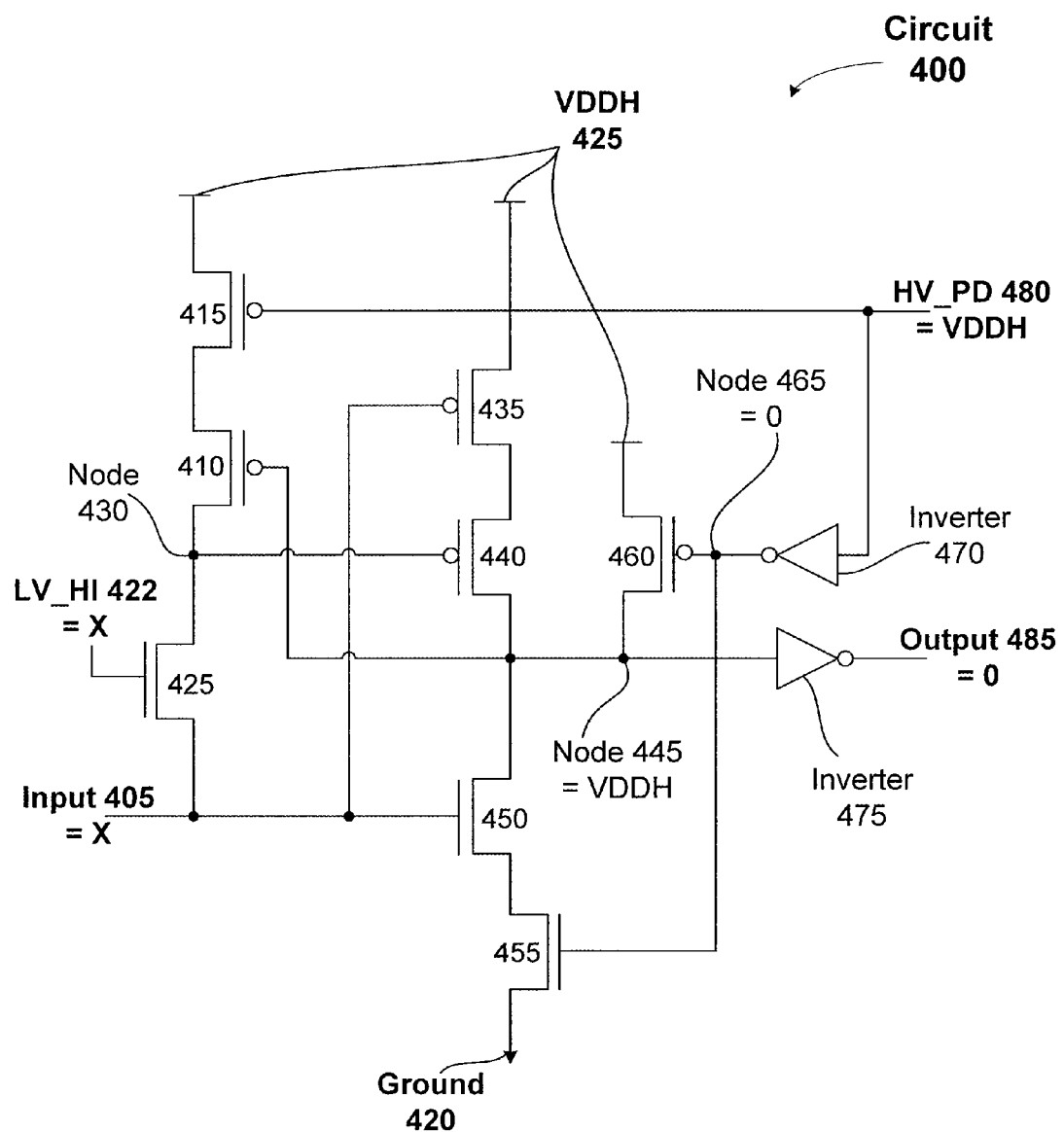
FIG. 4C illustrates the level shifter circuit of FIG. 4A when the power down signal is asserted, in accordance with one or more aspects of the present invention.

FIG. 4C illustrates the voltage level shifter circuit 400 of FIG. 4A when the power down signal, HV_PD 480 is enabled using VDDH, in accordance with one or more aspects of the present invention. When HV_PD 480 is at VDDH, the voltages of LV_HI 422 and input 405 can be unknown since they are ignored. Transistor 415 is disabled to turn off the direct current leakage path through transistors 415, 410, and 425. Node 465 is discharged to the ground 420 and transistor 455 is disabled to turn off the direct current leakage path through transistors 435, 440, 450, and 455. Transistor 460 is activated and node 445 is pulled up to VDDH 425 causing inverter 475 to discharge output 485 to the ground 420.

Figure 5:
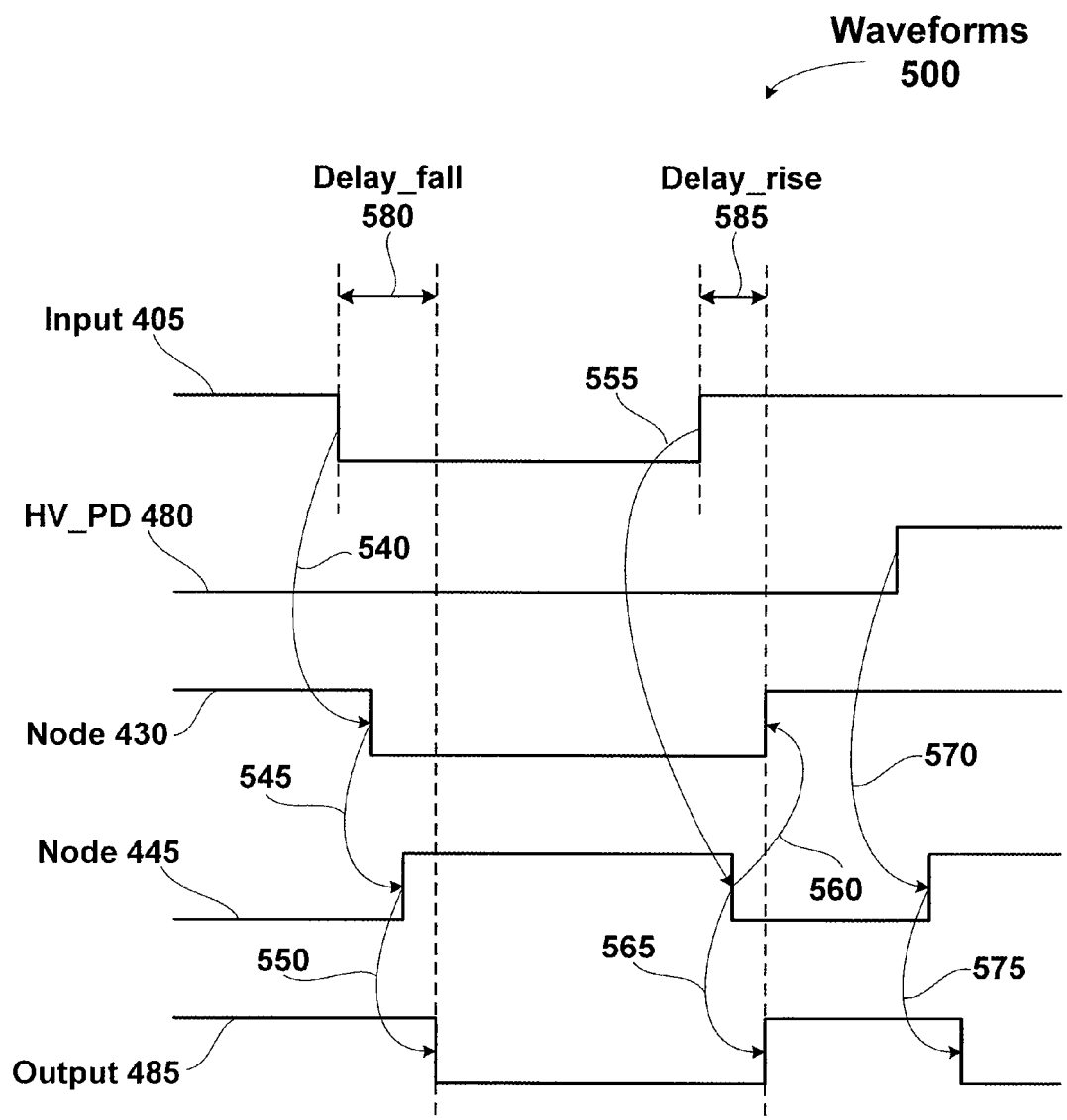
FIG. 5 is a signal diagram showing waveforms of the level shifter circuit for shifting signals from a low voltage domain to a high voltage domain, according to one embodiment of the invention.

FIG. 5 is a signal diagram showing waveforms 500 of the voltage level shifter circuit 400 for shifting signals from a low voltage domain to a high voltage domain, according to one embodiment of the invention. Input 405 is initially at the VDDL voltage and HVPD 480 is initially at the ground voltage. The node 430 is at the VDDH voltage, node 445 is at the ground voltage, and output 485 is at the VDDH voltage. Input 405 transitions from the VDDL voltage to the ground voltage. In response, arrow 540 indicates that node 430 transitions from VDDH to the ground voltage. In response, arrow 545 indicates that node 445 transitions from the ground voltage to the VDDH voltage. In response to the node 445 transitioning, arrow 550 indicates that that the output 485 transitions from the VDDH voltage to the ground voltage.

At a later point in time, input 405 transitions from the ground voltage to the VDDL voltage. In response, arrow 555 indicates that node 445 transitions from the VDDH voltage to the ground voltage. In response to node 445 transitioning, arrow 560 indicates that node 430 transitions from the ground voltage to the VDDH voltage. In response to the node 445 transitioning, arrow 565 indicates that that the output 485 transitions from the ground voltage to the VDDH voltage.

At an even later point in time, HV_PD 480 transistors from the ground voltage to the VDDH voltage to enter a power down mode. In response, arrow 570 indicates that node 445 transitions from the ground voltage to the VDDH voltage. In response to node 445 transitioning, arrow 575 indicates that the output 485 transitions from the VDDH voltage to the ground voltage. The direct current leakage paths between VDDH 425 and ground 420 are disabled.

The output 485 falling delay, delay_fall 580 is three gates. The output 485 rising delay, delay_rise 585 is two gates. Although FIG. 5 shows each gate having an equal delay, in some embodiments of the present invention the gate delay of different transistors may vary. It is likely that delay_rise 585 will not equal delay_fall 580. In order to increase delay_rise 585 to equal delay_fall 580, the sizes of transistors 450 and 455 should be reduced. However, reducing the size of transistors 450 and 455 conflicts with the requirement that transistors 450 and 455 need to be strong enough to overpower transistor 435 when the input 405 is at the VDDL voltage. In order to ensure that node 445 can be pulled down to the ground voltage 420, transistors 450 and 455 need to be strong enough to overpower transistor 435 assuming that it is fully activated. Therefore, voltage shifter circuit 400 is not suitable for shifting clock signals since those signals require equal rising and falling delays and equal slew rates in order to provide a 50/50 duty cycle clock signal.

Shifting a Clock Signal from a Low Voltage Domain to a High Voltage Domain

Figure 6A:
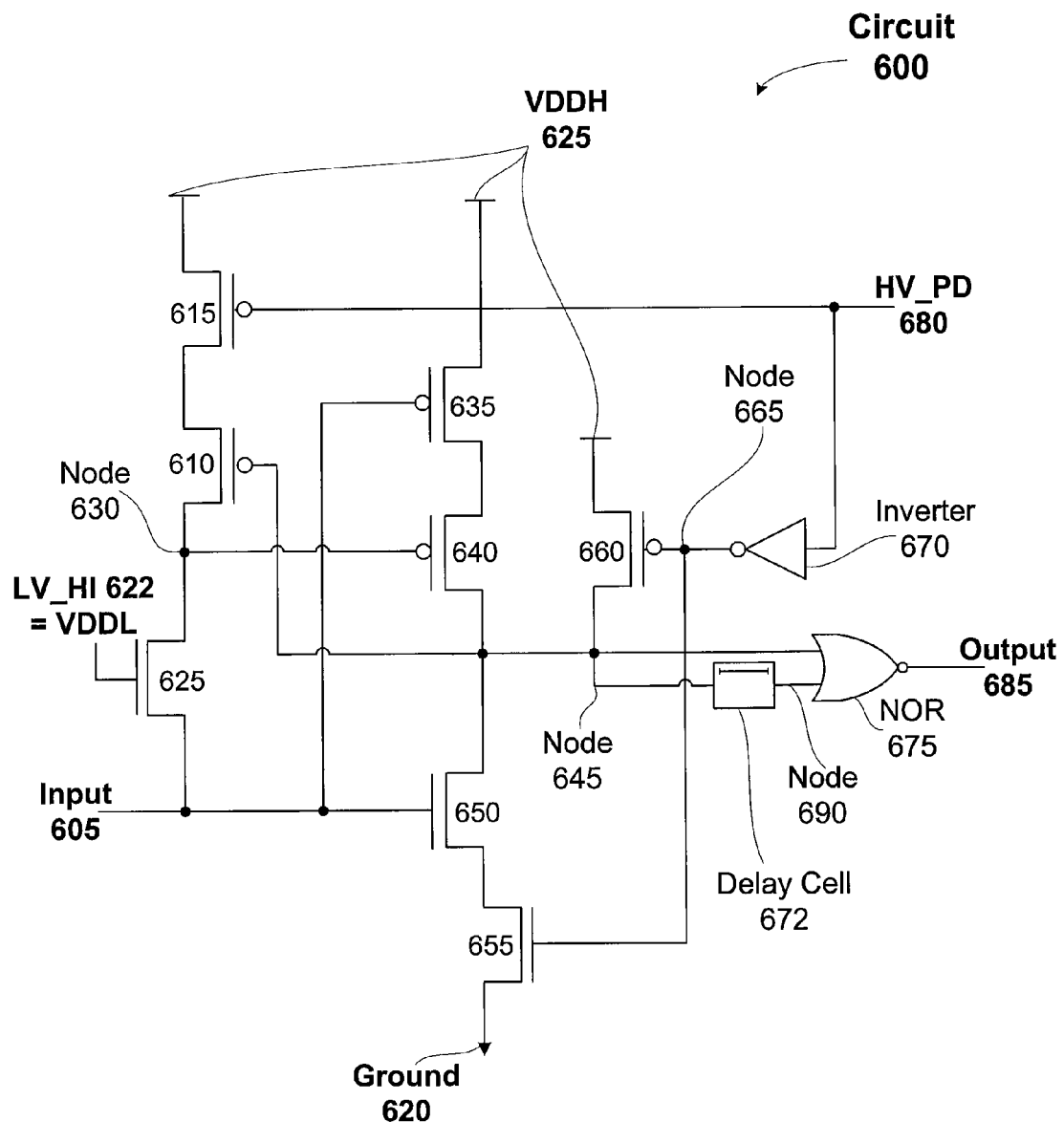
FIG. 6A illustrates a level shifter circuit for shifting a clock signal from a low voltage domain to a high voltage domain with a power down mode enable signal, in accordance with one or more aspects of the present invention.

FIG. 6A illustrates a voltage level shifter circuit 600 for shifting a clock signal from a low voltage domain to a high voltage domain with a power down mode enable signal 680, in accordance with one or more aspects of the present invention. Like voltage level shifter circuit 400, voltage level shifter circuit 600 does not have a direct current leakage path between VDDH 625 and ground 620 and therefore does not consume as much power as circuit 100. Voltage level shifter circuit 600 also requires a single input 605 instead of dual inputs as required by circuit 200.

A power down signal is input to HV_PD 680 that clamps the output 685 to ground 620 when HV_PD 680 is VDDH so no direct currents flow in voltage level shifter 600 when the input 605 and LV_HI 622 are unknown, i.e. floating. When HV_PD 680 is VDDH, the LV_HI 622 input and the input 605 are ignored and can be at ground, VDDL, or anywhere between. The input 605 is the single rail input coming from the low voltage domain. LV_HI 622 is the reference voltage from the low voltage domain, VDDL. HV_PD 680 and LV_HI 622 are not timing critical and can therefore be connected to hundreds of voltage level shifters 600, so that the number of signals that are routed is dominated by the signal rail input 605 and output 685.

The inverter 475 of voltage level shifter circuit 400 is replaced with a two input NOR gate 675. A delay cell 672 is inserted between node 645 and a second input to the NOR gate 675. A node 690 produces a signal that is a delayed version of the signal at node 645. The delay cell 672 may have a fixed delay or may be programmed to change the delay.

When the VDDL voltage is applied to LV_HI 622, ground is applied to HV_PD 680, and VDDL is applied to input 605, the output 685 is charged to VDDH. Transistor 615 is activated when HV_PD 680 is at the ground voltage and the source of transistor 610 is pulled to VDDH 625 by transistor 615. The inverter 670 pulls node 665 to VDDH and activates transistor 655 to discharge the source of transistor 650 to ground. Transistor 660 is disabled by the inverter 670 pulling node 665 to VDDH, isolating node 645 from VDDH 625.

Transistor 650 is activated by the input 605 and node 645 is discharged to the ground 620 through transistors 650 and 655. In order for the output 685 to transition from the ground voltage to the VDDH voltage both inputs, nodes 645 and 690 need to be at the ground voltage. When node 645 is discharged to the ground, after a delay node 690 is also discharged to the ground voltage, and then the NOR gate 675 pulls the output 685 to VDDH 625.

Transistor 635 is partially or fully activated, depending on the value of VDDL, VDDH, and the threshold voltage. The size of transistors 650 and 655 will guarantee that node 645 can be pulled down to the ground 620 even if transistor 635 is fully on. Transistors 640 and 610 are used to cut off the direct current that would flow through activated transistors 635 and 650. Since the node 645 is discharged to the ground 620, transistor 610 is activated and transistor 610 pulls up the node 630 to VDDH. The source and gate of transistor 640 are both at VDDH, so transistor 640 is disabled and there is no direct current flowing from VDDH 625 to ground 620 through transistors 635, 640, 650, and 655. The drain of transistor 625 is at VDDH and the gate and the source of transistor 625 are both at VDDL, so transistor 625 is disabled.

When the VDDL voltage is applied to LV_HI 622 and ground is applied to HV_PD 680 and the input 605, the output 685 is discharged to the ground. Transistor 615 is activated when HV_PD 680 is at the ground voltage and the source of transistor 610 is pulled to VDDH 625 by transistor 615. The inverter 670 pulls node 665 to VDDH and activates transistor 655 to discharge the source of transistor 650 to ground. Transistor 660 is disabled by the inverter 670 pulling node 665 to VDDH, isolating node 645 from VDDH 625. Transistor 650 is not activated and transistor 635 is activated to pull the source of transistor 640 to VDDH 625. Transistor 625 is activated and the gate of transistor 640, node 630 is discharged to the ground voltage, activating transistor 640. Transistors 635 and 640 pull node 645 to VDDH.

For the output 685 to transition from VDDH 625 to the ground voltage, only one of the two inputs to the NOR gate 675 needs to be at the VDDH voltage. Therefore, when the node 645 transitions from the ground voltage to the VDDH voltage, the NOR gate 675 discharges the output 685 to the ground voltage 620. Transistor 610 is a weak pull-up device and transistor 625 is sized to guarantee that transistor 625 can pull node 630 to ground when transistor 610 is activated. There is no direct current flowing from VDDH 625 to the ground 620.

When HV_PD 480 is at VDDH, the voltages of LV_HI 622 and input 605 can be unknown since they are ignored. Transistor 615 is disabled to turn off the direct current leakage path through transistors 615, 610, and 625. Node 665 is discharged to the ground 620 and transistor 655 is disabled to turn off the direct current leakage path through transistors 635, 640, 650, and 655. Transistor 660 is activated and node 645 is pulled up to VDDH 625 causing the NOR gate 675 to discharge output 685 to the ground 620.

Figure 6B:
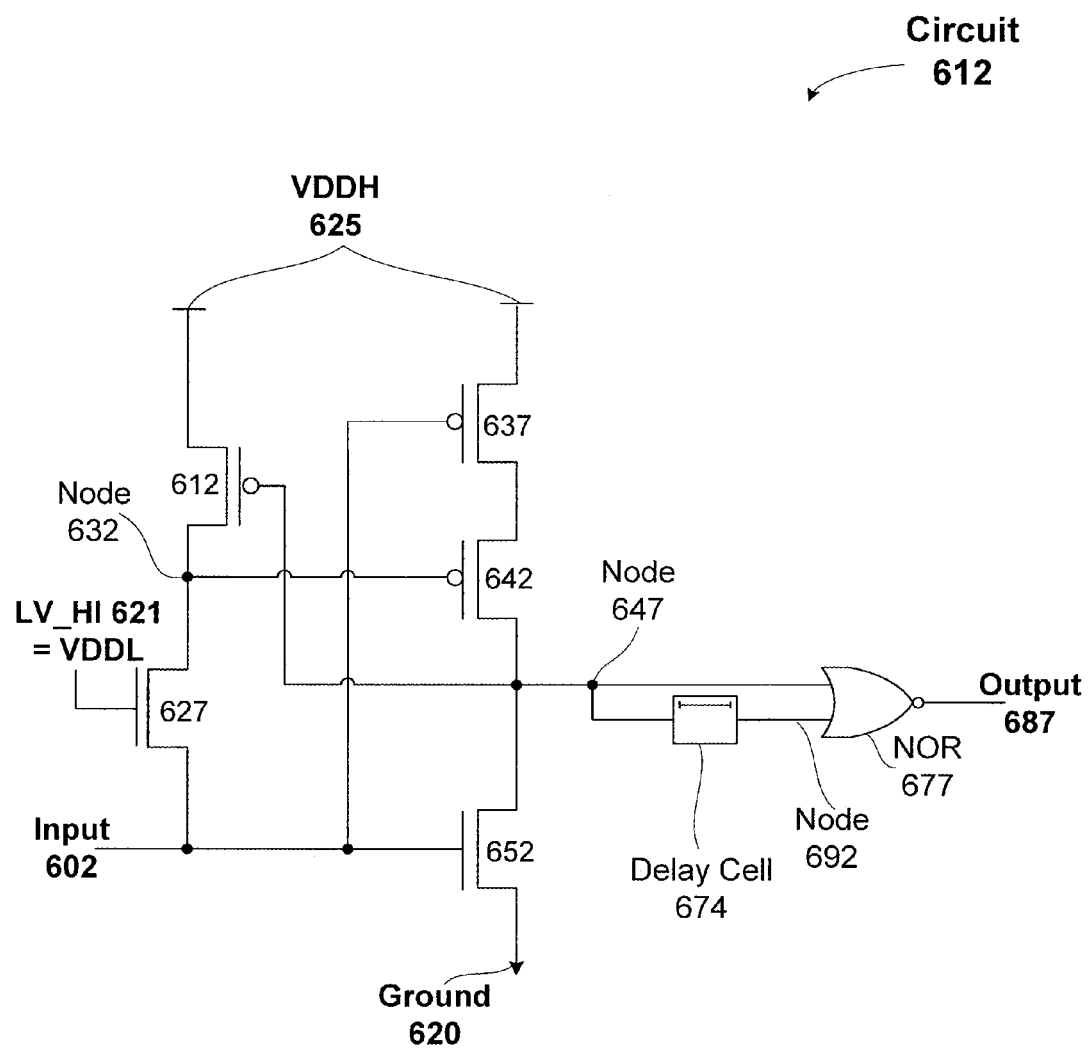
FIG. 6B illustrates a level shifter circuit for shifting a clock signal from a low voltage domain to a high voltage domain, in accordance with one or more aspects of the present invention.

FIG. 6B illustrates a voltage level shifter circuit 612 for shifting a clock signal from a low voltage domain to a high voltage domain, in accordance with one or more aspects of the present invention. Voltage level shifter circuit 612 is not configured to have a power down mode. Like voltage level shifter circuits 400 and 600, voltage level shifter circuit 612 does not have a direct current leakage path between VDDH 625 and ground 620 and therefore does not consume as much power as circuit 100. Voltage level shifter circuit 612 also requires a single input 602 instead of dual inputs as required by circuit 200.

When the VDDL voltage is applied to LV_HI 621 and VDDL is applied to input 602, the output 687 is charged to VDDH. Transistor 652 is activated by the input 602 and node 647 is discharged to the ground 620 through transistor 652. In order for the output 687 to transition from the ground voltage to the VDDH voltage both inputs, nodes 647 and 692 need to be at the ground voltage. When node 647 is discharged to the ground, after a delay node 692 is also discharged to the ground voltage, and then the NOR gate 677 pulls the output 687 to VDDH 625.

Transistor 637 is partially or fully activated, depending on the value of VDDL, VDDH, and the threshold voltage. The size of transistor 652 will guarantee that node 647 can be pulled down to the ground 620 even if transistor 637 is fully on. Transistors 642 and 612 are used to cut off the direct current that would flow through activated transistors 637 and 652. Since the node 647 is discharged to the ground 620, transistor 612 is activated and transistor 612 pulls up the node 632 to VDDH. The source and gate of transistor 642 are both at VDDH, so transistor 642 is disabled and there is no direct current flowing from VDDH 625 to ground 620 through transistors 637, 642, and 652. The drain of transistor 627 is at VDDH and the gate and the source of transistor 627 are both at VDDL, so transistor 627 is disabled.

When the VDDL voltage is applied to LV_HI 621 and ground is applied to the input 602, the output 687 is discharged to the ground. Transistor 652 is not activated and transistor 637 is activated to pull the source of transistor 642 to VDDH 625. Transistor 627 is activated and the gate of transistor 642, node 632 is discharged to the ground voltage, activating transistor 642. Transistors 637 and 642 pull node 647 to VDDH.

For the output 687 to transition from VDDH 625 to the ground voltage, only one of the two inputs to the NOR gate 677 needs to be at the VDDH voltage. Therefore, when the node 647 transitions from the ground voltage to the VDDH voltage, the NOR gate 677 discharges the output 687 to the ground voltage 620. Transistor 612 is a weak pull-up device and transistor 627 is sized to guarantee that transistor 627 can pull node 632 to ground when transistor 612 is activated. There is no direct current flowing from VDDH 625 to the ground 620.

Figure 7A:
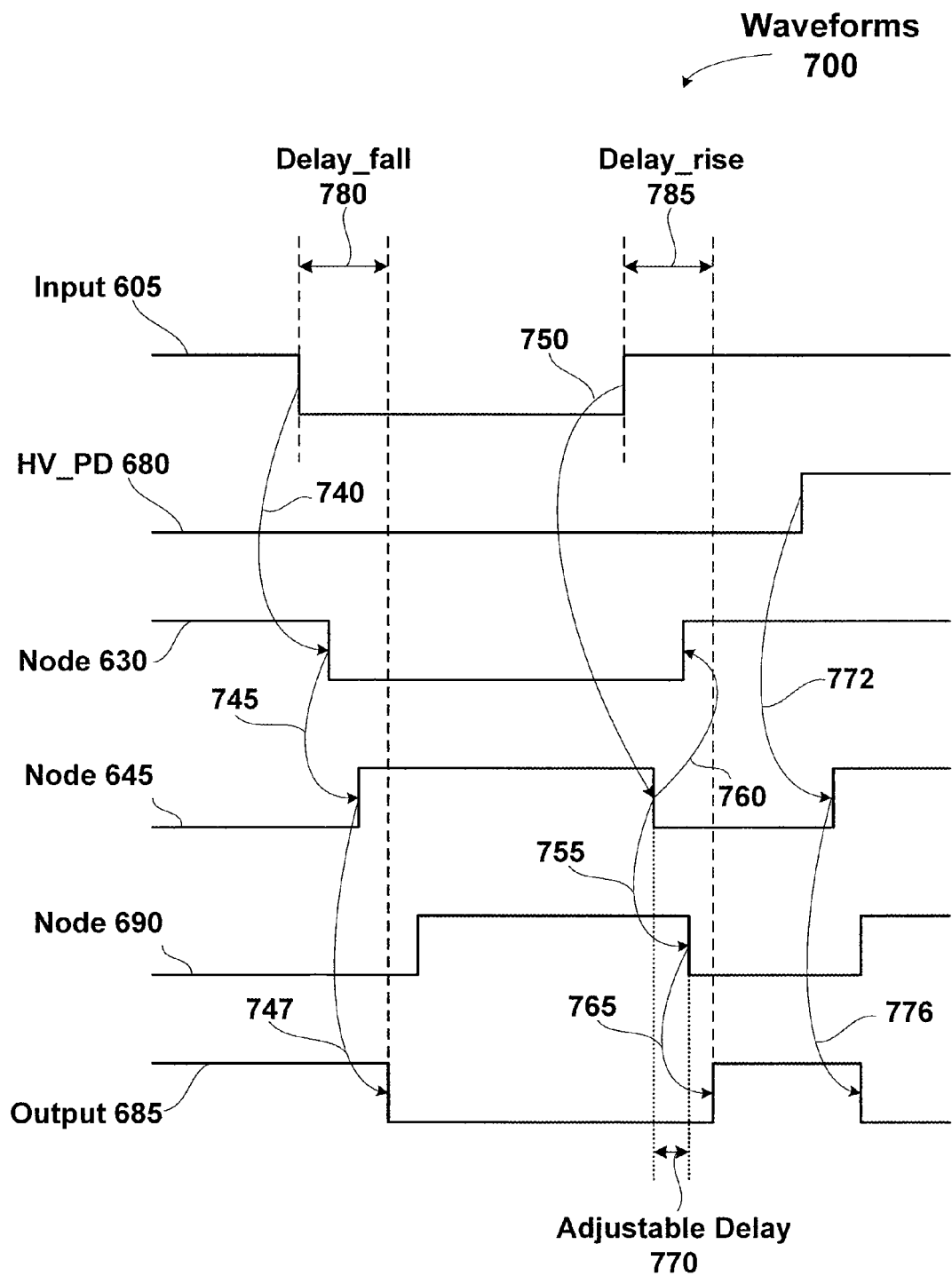
FIG. 7A is a signal diagram showing waveforms of the level shifter circuit for shifting a clock signal from a low voltage domain to a high voltage domain, according to one embodiment of the invention.

FIG. 7A is a signal diagram showing waveforms 700 of the voltage level shifter circuits 600 and 612 for shifting a clock signal from a low voltage domain to a high voltage domain, according to one embodiment of the invention. Input 605 (or 602) is initially at the VDDL voltage and HV_PD 680 is initially at the ground voltage. The node 630 (or 632) is at the VDDH voltage, node 645 (or 647) is at the ground voltage, and output 685 (or 687) is at the VDDH voltage. Input 605 transitions from the VDDL voltage to the ground voltage. In response, arrow 740 indicates that node 630 (or 632) transitions from VDDH to the ground voltage. In response, arrow 745 indicates that node 645 (or 647) transitions from the ground voltage to the VDDH voltage. In response to the node 645 (or 647) transitioning, arrow 747 indicates that that the output 685 (or 687) transitions from the VDDH voltage to the ground voltage. Note that node 690 (or 692) is a delayed version of node 645 (or 647). The critical path of the falling delay of the output 685 (or 687), delay_fall 780 has not changed compared with the voltage level shifter circuit 600. However, the critical path of the rising delay of the output 685 (or 687), delay_rise 785 has changed.

At a later point in time, input 605 (or 602) transitions from the ground voltage to the VDDL voltage. In response, arrow 750 indicates that node 645 (or 647) transitions from the VDDH voltage to the ground voltage. In response to node 645 (or 647) transitioning, arrow 760 indicates that node 645 (or 647) transitions from the ground voltage to the VDDH voltage. In response to the node 645 (or 647) transitioning, arrow 765 indicates that the node 690 (or 692) transitions from the VDDH to the ground voltage after a delay that is introduced by the delay cell 672 (or 674). In response to the node 690 (or 692) transitioning, the output 685 (or 687) transitions from the ground voltage to the VDDH voltage as indicated by arrow 765. In response to the node 645 (or 647) transitioning, arrow 760 indicates that node 630 (or 632) transitions from the ground voltage to the VDDH voltage.

At an even later point in time, HV_PD 680 transistors from the ground voltage to the VDDH voltage to enter a power down mode. In response, arrow 772 indicates that node 645 transitions from the ground voltage to the VDDH voltage. In response to node 645 transitioning, arrow 776 indicates that the output 685 transitions from the VDDH voltage to the ground voltage. The Direct current leakage paths between VDDH 625 and ground 620 are disabled.

The output 685 falling delay, delay_fall 780 is three gates and the rising delay, delay_rise 785 equals delay_fall 780. Although FIG. 7A shows each gate having an equal delay, in some embodiments of the present invention the gate delay of different transistors may vary. Therefore, voltage shifter circuits 600 and 612 are suitable for shifting clock signals since those voltage shifter circuits 600 and 612 are configured to produce equal rising and falling delays and equal slew rates in order to provide a 50/50 duty cycle clock signal.

Figure 7B:
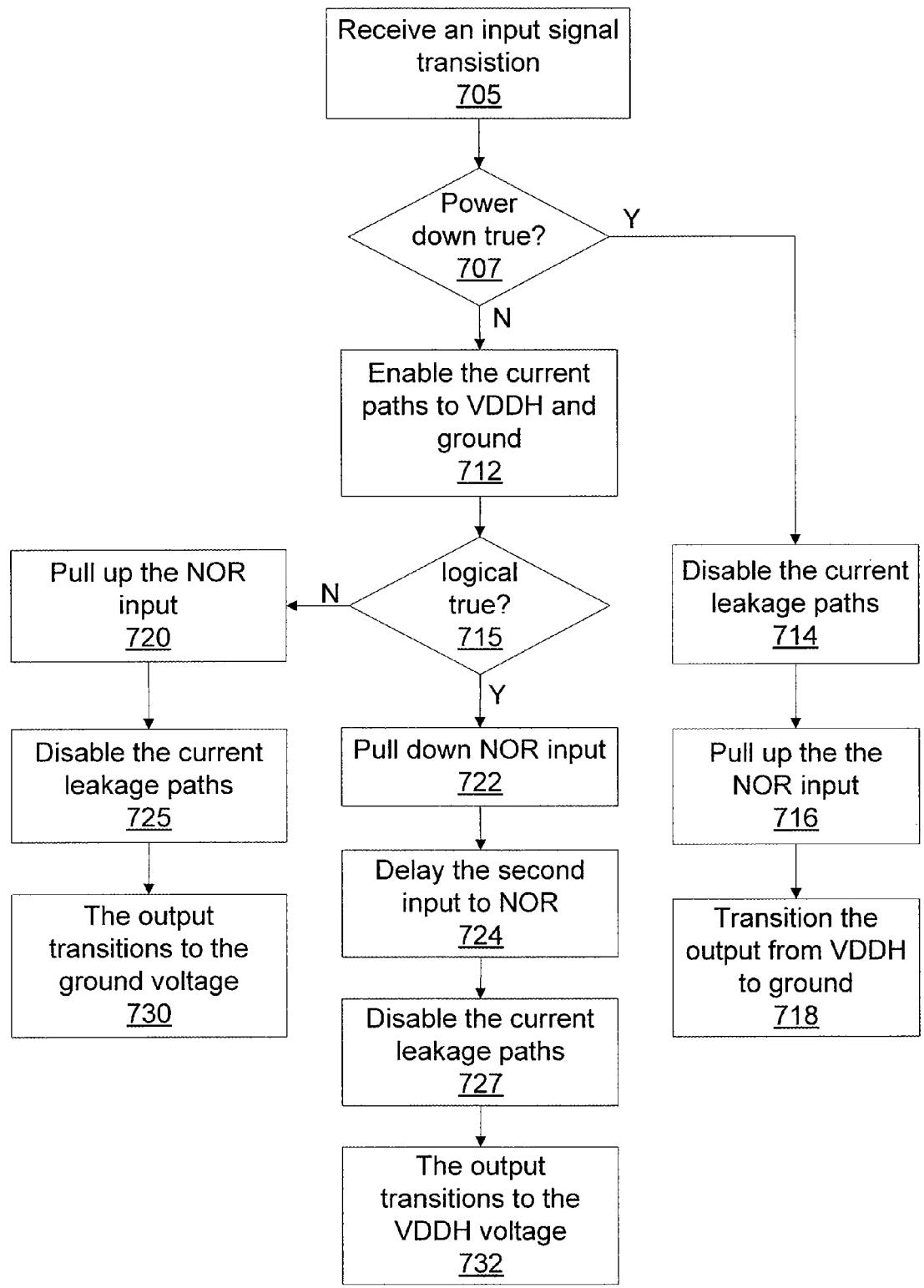
FIG. 7B is a flow diagram showing method steps for shifting a clock signal from a low voltage domain to a high voltage domain, in accordance with one or more aspects of the present invention.

FIG. 7B is a flow diagram showing method steps for shifting a clock signal from a low voltage domain to a high voltage domain using the level shifter circuits 600 and 612, in accordance with one or more aspects of the present invention. In step 705 the voltage level shifter circuit 600 or 612 receives an input signal transition at the input 605 or 602. The input signal will be at a ground voltage level (logical false) or at a VDDL voltage (logical true). In step 707 the polarity (logical true or false) of the power down signal, HV_PD 680 is determined.

The power down signal is assumed to be false for voltage level shifter circuit 612. When the power down signal is asserted, in step 714 the current leakage paths through transistors 615 and 655 are disabled. In step 716 the transistor 660 that is coupled to the first input to the NOR gate 675 is activated to pull node 645 up to VDDH. In step 718 the NOR gate 675 discharges output 685, transitioning output 685 from VDDH to ground.

If, in step 707 the power down signal is negated, then in step 712 the current paths to VDDH through transistor 615 and to ground through transistor 655 are enabled. In step 715 the voltage of the input 605 (or 602) is determined, and, when the voltage is a logical true, the first input to the NOR gate 676 (or 677) is pulled down in step 722. In step 724 the second input to the NOR gate 676 (or 677) is delayed by delay cell 672 (or 674). In step 727 the direct current leakage paths are disabled and in step 732 the output 685 (or 687) is pulled to VDDH by the NOR 675 (or 677).

If, in step 712 the voltage of the input 405 is determined as a logical false (not a logical true), then in step 720 the first input to the NOR gate 675 (or 677) is pulled up to VDDH. In step 725 the direct current leakage paths are disabled and in step 730 the output 685 (or 687) is discharged to the ground voltage by the NOR gate 675 (or 677).

System Overview

Figure 8:
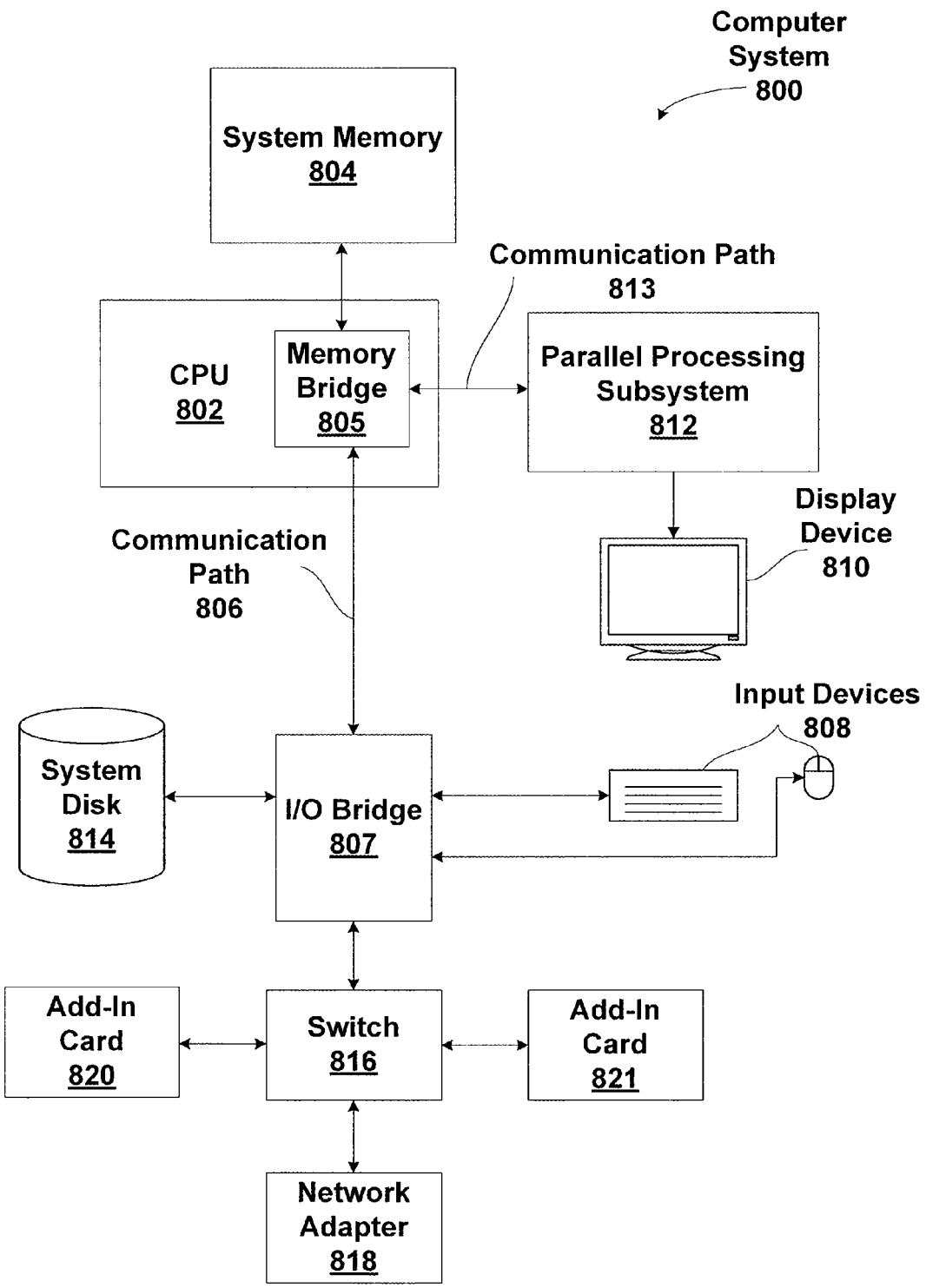
FIG. 8 is a block diagram illustrating a computer system configured to implement one or more aspects of the present invention.

FIG. 8 is a block diagram illustrating a computer system 800 configured to implement one or more aspects of the present invention. Computer system 800 includes a central processing unit (CPU) 802 and a system memory 804 communicating via a bus path through a memory bridge 805. Memory bridge 805 may be integrated into CPU 802 as shown in FIG. 8. Alternatively, memory bridge 805, may be a conventional device, e.g., a Northbridge chip, that is connected via a bus to CPU 802. Memory bridge 805 is connected via communication path 806 (e.g., a HyperTransport link) to an I/O (input/output) bridge 807. I/O bridge 807, which may be, e.g., a Southbridge chip, receives user input from one or more user input devices 808 (e.g., keyboard, mouse) and forwards the input to CPU 802 via path 806 and memory bridge 805. A parallel processing subsystem 812 is coupled to memory bridge 805 via a bus or other communication path 813 (e.g., a PCI Express, Accelerated Graphics Port, or HyperTransport link); in one embodiment parallel processing subsystem 812 is a graphics subsystem that delivers pixels to a display device 810 (e.g., a conventional CRT or LCD based monitor). A system disk 814 is also connected to I/O bridge 807. A switch 816 provides connections between I/O bridge 807 and other components such as a network adapter 818 and various add-in cards 820 and 821. Other components (not explicitly shown), including USB or other port connections, CD drives, DVD drives, film recording devices, and the like, may also be connected to I/O bridge 807. Communication paths interconnecting the various components in FIG. 8 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 812 incorporates circuitry optimized for graphics and video processing, including, for example, video output circuitry, and constitutes a graphics processing unit (GPU). In another embodiment, the parallel processing subsystem 812 incorporates circuitry optimized for general purpose processing, while preserving the underlying computational architecture, described in greater detail herein. In yet another embodiment, the parallel processing subsystem 812 may be integrated with one or more other system elements, such as the memory bridge 805, CPU 802, and I/O bridge 807 to from a system on chip (SoC). One or more of CPU 802, parallel processing sub-system 812, I/O bridge 807, and switch 816 may include a voltage level shifter circuit 400 for shifting a signal from a low voltage domain to a high voltage domain. One or more of CPU 802, parallel processing sub-system 812, I/O bridge 807, and switch 816 may include a voltage level shifter circuit 600 or 612 for shifting a clock signal from a low voltage domain to a high voltage domain.

It will be appreciated that the system shown herein is illustrative and that variations and modifications are possible. The connection topology, including the number and arrangement of bridges, may be modified as desired. For instance, in some embodiments, system memory 804 is connected to CPU 802 directly rather than through a bridge, and other devices communicate with system memory 804 via memory bridge 805 and CPU 802. In other alternative topologies, parallel processing subsystem 812 is connected to I/O bridge 807 or directly to CPU 802, rather than to memory bridge 805. In still other embodiments, one or more of CPU 802, I/O bridge 807, parallel processing subsystem 812, and memory bridge 805 may be integrated into one or more chips. The particular components shown herein are optional; for instance, any number of add-in cards or peripheral devices might be supported. In some embodiments, switch 816 is eliminated, and network adapter 818 and add-in cards 820, 821 connect directly to I/O bridge 807.

In sum, a technique for shifting the voltage level of signals from the low voltage domain to the high voltage domain is disclosed, where VDDH is the supply voltage of the high voltage domain and VDDL is the supply voltage of the low voltage domain. The voltage level shifting circuits 400, 600, and 612 uses a single input rather than dual rail inputs and do not produce a direct current in order to reduce the power consumption. The voltage level shifting circuits 600 and 612 may also be used to shift a clock signal since the delays of the rising and falling edges of the clock signal are matched by using a delay cell 672 or 674. A power down mode signal is provided from the high voltage domain for input to the voltage level shifting circuit 600 in order to clamp the output 685 to the ground so no direct currents flow in voltage level shifters 400 and 600 when the input and LV_HI are unknown, i.e. floating.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A voltage level shifter circuit for shifting an input signal from a low voltage domain to a high voltage domain, comprising:
   a NOR gate configured to receive a first intermediate signal at a first input and a second intermediate signal that is a delayed version of the first input at a second input and produce an output for the high voltage domain that is a voltage shifted version of the input signal;
   a first NMOS transistor that is coupled between the first input of the NOR gate and a ground voltage and configured to disable a direct current leakage path between a high voltage supply of the high voltage domain and the ground voltage when the input signal is at the ground voltage; and
   a first PMOS transistor that is coupled to the high voltage supply of the high voltage domain and configured to disable the direct current leakage path between the high voltage supply of the high voltage domain and the ground voltage when the input signal is at a low voltage supply of the low voltage domain.

2. The voltage level shifter circuit of claim 1, further comprising a second NMOS transistor and a second PMOS transistor that are configured to pull the first input to the NOR gate to the high supply voltage when the input signal transitions from a low supply voltage from the low voltage domain to the ground voltage.

3. The voltage level shifter circuit of claim 2, wherein a gate of the second NMOS transistor is coupled to the low supply voltage.

4. The voltage level shifter circuit of claim 1, wherein the input signal is a clock signal.

5. The voltage level shifter circuit of claim 1, further comprising a delay cell that is configured to receive the first intermediate signal and produce the second intermediate signal as the delayed version of the first intermediate signal in order to match a rising delay to a falling delay of the output signal.

6. The voltage level shifter circuit of claim 1, wherein the first NMOS transistor is further configured to discharge the first input to the NOR gate to the ground voltage when the input signal transitions from the ground voltage to a low supply voltage from the low voltage domain.

7. The voltage level shifter circuit of claim 1, further comprising a power down input that is configured to receive a power down signal from the high voltage domain and clamp the output signal to the ground voltage.

8. A voltage level shifter circuit for shifting an input signal from a low voltage domain to a high voltage domain, comprising:
   an inverter circuit configured to receive a power down signal from the high voltage domain and produce a first intermediate signal;
   a NOR gate that is configured to produce an output signal for the high voltage domain that is a voltage shifted version of the input signal using a second intermediate signal received at a first input and a delayed version of the second intermediate signal that is received at a second input;
   a first PMOS transistor that is coupled between a high voltage supply of the high voltage domain and the first input to the NOR gate and configured to receive the first intermediate signal at a gate and pull the first input to the NOR gate up to the high voltage supply when the power down signal transitions to the high voltage supply;
   a second PMOS transistor that is coupled to the high voltage supply and configured to disable a direct current leakage path between the high voltage supply and the ground voltage when the power down signal transitions to the high voltage supply; and
   a first NMOS transistor that is coupled to a ground voltage and configured to disable the direct current leakage path when the power down signal transitions to the high voltage supply.

9. The voltage level shifter circuit of claim 8, further comprising a second NMOS transistor that is coupled between a node and the input signal with a gate at a low voltage supply of the low voltage domain when the power down signal is at the ground voltage.

10. The voltage level shifter circuit of claim 9, wherein the second NMOS transistor is configured to enable the first input of the NOR gate to be charged to the high voltage supply when the input signal is at the ground voltage.

11. The voltage level shifter circuit of claim 8, wherein the first PMOS transistor is configured to isolate the first input to the NOR gate from the high voltage supply when the power down signal transitions to the ground voltage.

12. The voltage level shifter circuit of claim 8, further comprising a second NMOS transistor that is coupled between the first input to the NOR gate and the first NMOS transistor and configured to disable the direct current leakage path when the power down signal is at the ground voltage and the input signal transitions to the ground voltage.

13. The voltage level shifter circuit of claim 8, further comprising a third PMOS transistor that is coupled to the first input of the NOR gate and configured to disable the direct current leakage path when the power down signal is at the ground voltage and the input signal is at a low voltage supply of the low voltage domain.

14. The voltage level shifter circuit of claim 8, further comprising a delay cell that is configured to receive the second intermediate signal and produce the delayed version of the second intermediate signal that is received at the second input of the NOR gate in order to match a rising delay to a falling delay of the output signal.

* * * * *